(12) United States Patent
Hutton et al.

(10) Patent No.: US 7,248,072 B1
(45) Date of Patent: Jul. 24, 2007

(54) SWAP MUX TO RELIEVE LOGIC DEVICE INPUT LINE STRESS

(75) Inventors: Michael Hutton, Mountain View, CA (US); Vaughn T. Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 505 days.

(21) Appl. No.: 10/777,603

(22) Filed: Feb. 11, 2004

(51) Int. Cl.
*H03K 19/177* (2006.01)

(52) U.S. Cl. .......................................... 326/41; 326/47

(58) Field of Classification Search ............ 326/37–41, 326/47
See application file for complete search history.

(56) References Cited

U.S. PATENT DOCUMENTS 6,184,710 B1 * 2/2001 Mendel ........................ 326/41
6,492,834 B1 * 12/2002 Lytle et al. .................... 326/41
6,614,261 B2 * 9/2003 Ngai et al. .................... 326/41

* cited by examiner

*Primary Examiner*—James H. Cho
(74) *Attorney, Agent, or Firm*—Beyer Weaver LLP

(57) ABSTRACT

Disclosed is a method an apparatus for selectively providing additional inputs into a logic block, such as a LAB of a PLD, carrying out a logic function requiring a relatively high number of inputs. A PLD in accordance with the present invention includes at least first and second LABs. A plurality of signal lines are capable of driving the second LAB and a plurality of output lines are driven by the first LAB. The PLD also includes a swap multiplexer (MUX) having a first selectable input capable of being driven by the output lines and a second selectable input capable of being driven by the signal lines. An output of the swap MUX is capable of driving the first LAB.

21 Claims, 5 Drawing Sheets

SWAP MUX TO RELIEVE LOGIC DEVICE INPUT LINE STRESS

BACKGROUND OF THE INVENTION

Programmable logic devices (PLDS) (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices typically provide an "off the shelf" device having at least a portion that can be electrically programmed to meet a user's specific needs. Application specific integrated circuits (ASICs) have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs may include blocks of smaller logic elements (LEs) which typically have a number of inputs. The blocks containing LEs are sometimes referred to as logic array blocks (LABs; also referred to by other names, e.g., configurable logic blocks, or CLBs). LEs, in turn, may contain components to programmably carry out different types of logic functions. LABs containing LEs may be arranged in a two dimensional array in a PLD.

In order to input and direct logic signals to LEs, PLDs can include a number of types of signal lines. A first type of line, referred to herein as a global line, can carry signals between LABs. Other lines can be driven by global lines to carry signals into a particular LAB. These lines are referred to herein as LAB lines (LAB lines can also be referred to as logic input MUX or "LIM" lines). LAB lines 14 typically include between 20 to 40 individual lines, though greater or fewer lines may also be included. The architecture of a LAB may also include LE output lines which can be routed back to drive the inputs of either the LE that drove the particular output or a different LE, typically within the same LAB. Thus, it is not necessary, and typically not the case, that a LAB is driven by enough LAB lines to drive every input of every LE in the LAB.

However, it is sometimes that case that a logic function which could otherwise be carried out by a single LAB cannot be because the particular logic function requires more inputs into the lab than are provided by the LAB lines. In such a case, in configuring a PLD to carry out the logic function, it may be necessary to split the logic function between two or more LABs in the PLD. Such configuration, though, can cause inefficient use of physical resources and increased timing delays.

BRIEF SUMMARY OF THE INVENTION

The present invention includes a method and apparatus for selectively providing additional inputs into a cluster of logic blocks (referred to herein as a Logic Array block or LAB) carrying out a logic function requiring a relatively high number of inputs. A PLD in accordance with the present invention includes at least first and second LABs. A plurality of signal lines are capable of driving the second LAB and a plurality of output lines are driven by the first LAB. The PLD also includes one or more swap multiplexers (MUXes) having a first selectable input capable of being driven by an output line and a second selectable input capable of being driven by a signal line. An output of the swap MUX is capable of driving the first LAB. In another aspect of the present invention, the first LAB of the PLD includes plurality of first logic elements (LEs) and the second LAB includes a plurality second LEs. The output lines are driven by the first LEs and the signal lines are capable of driving the second LEs. The output of the swap MUX is capable of driving the first LEs.

In another aspect of the present invention, a method of driving LABs in a PLD includes providing at least first and second LABs in the PLD. The first LAB drives a plurality of output lines and second LAB is driven with a plurality of signal lines. A first selectable input of a swap MUX is driven by the output lines and a second selectable input of the swap MUX is driven by the signal lines. The output of the swap MUX drives the first LAB.

DETAILED DESCRIPTION OF THE INVENTION

Figure 1:
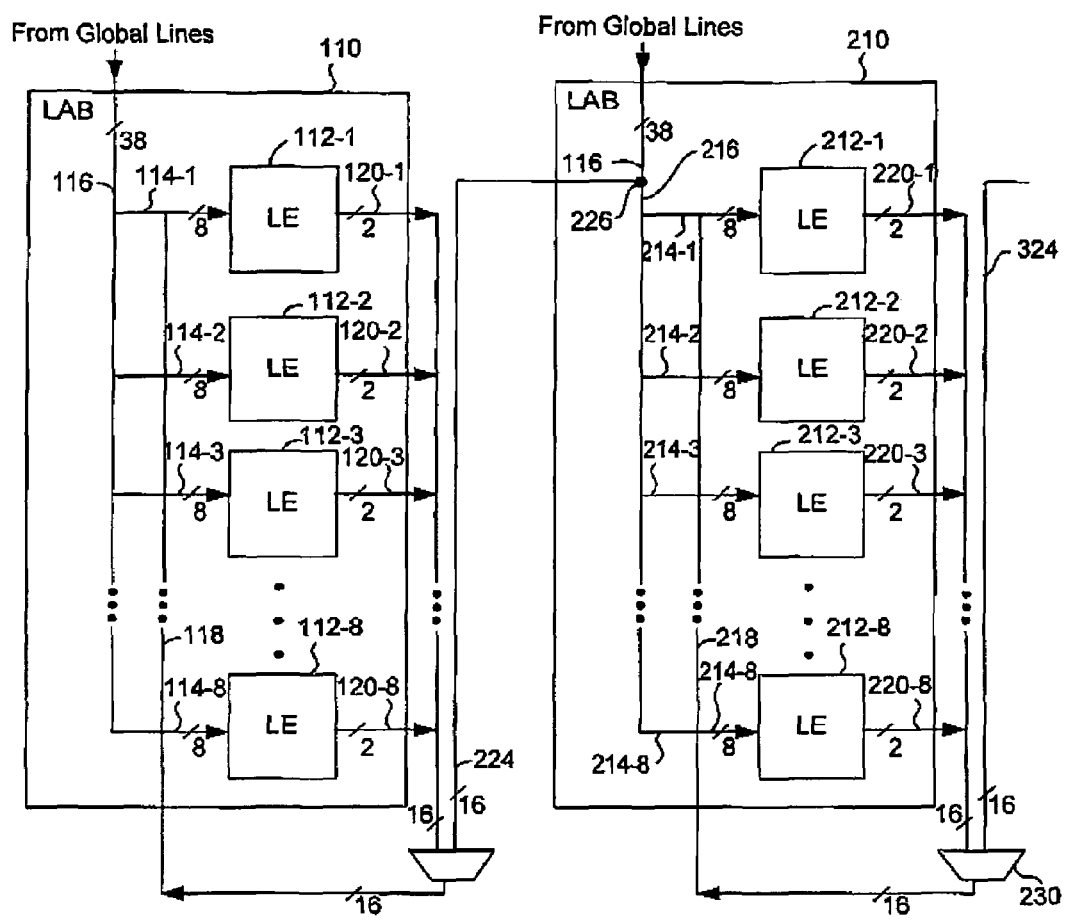
FIG. 1 is a schematic diagram illustrating a portion of a programmable logic device (PLD) including a swap multiplexer (MUX) and in which a first LAB can be driven by inputs which can also drive a second LAB in accordance with the present invention.

The present invention includes a method an apparatus for selectively providing additional inputs into a logic block, such as a LAB of a PLD, carrying out a logic function requiring a relatively high number of inputs. FIG. 1 is a schematic diagram of one embodiment of a LAB architecture showing how a LAB can be selectively provided with additional input lines in accordance with the present invention. FIG. 1 shows a portion 100 of a PLD including a first LAB 110 and second LAB 210 each having 8 LEs (only 4 LEs per LAB are shown in FIG. 1). LAB 110 includes LEs 112-1 through 112-8 and LAB 210 includes LEs 212-1 through 212-8. LAB 110 and LAB 210 may also include greater or fewer than 8 LEs. LAB 110 is driven by a set of LAB lines 116 and LAB 210 is driven by a set of LAB lines 216. Both LAB lines 116 and LAB lines 216 are preferably driven by global lines (not shown) included in a the PLD containing first and second LABs 110 and 210. In the example shown in FIG. 1, LAB lines 116 and 216 each preferably include 38 individual lines. It is also contemplated, however, that greater or fewer than 38 individual lines be included in each set of LAB lines 116 and 216, in particular as the number of LEs contained in the LAB is changed.

LEs 112-1 through 112-8 of LAB 110 include a set of input lines 114-1 through 114-8, respectively, and a set of local output lines 120-1 through 120-8, respectively. Global outputs from the LAB are not shown. Similarly, LEs 212-1 through 212-8 of LAB 210 includes a set of input lines 214-1 through 214-8, respectively, and a set of output lines 220-1 through 220-8, respectively. Preferably, sets of input lines 114-1 through 114-8 and 214-1 through 214-8 each include 8 lines and sets of local output lines 120-1 through 120-8 and 220-1 through 220-8 each include 2 individual lines. It is considered, however, that greater or fewer that 8 individual lines be included in each set of input lines 114-1 through 114-8 and 214-1 through 214-8 and greater or fewer that 2 outputs be included in sets of output lines 120-1 through 120-8 and 210-1 through 220-8.

Figure 2A:
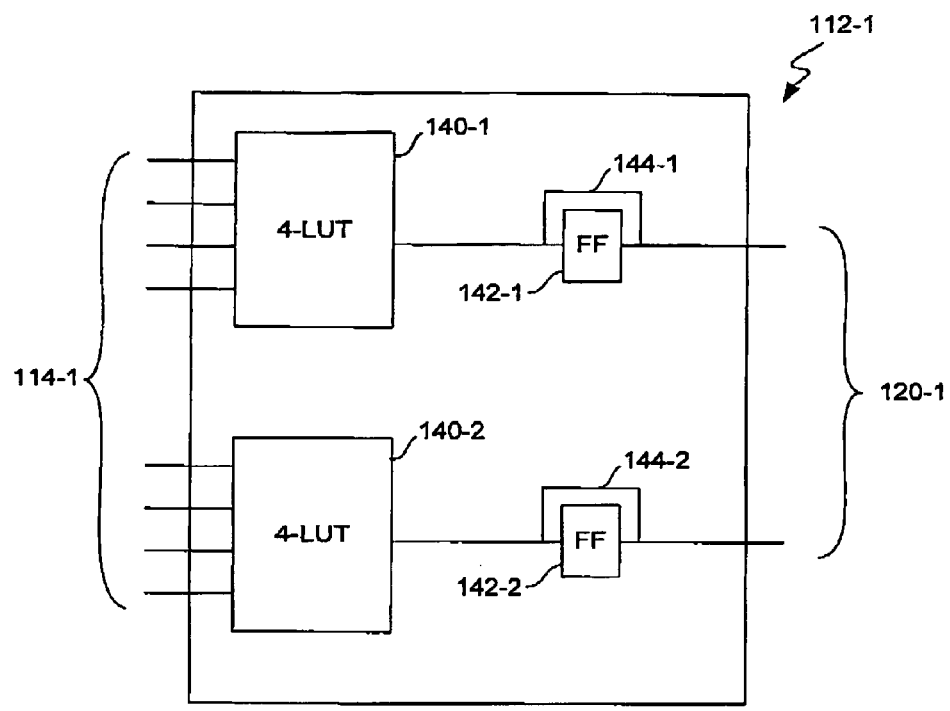
FIG. 2a is a schematic diagram illustrating an example of the details of a logic element shown in FIG. 1.

FIG. 2a is a schematic diagram illustrating one example of an LE 112-1. LEs 112-2 through 112-8 and 212-1 through 212-8 preferably include substantially the same architecture as LE 112-1 shown in FIG. 2. LE 112-1 preferably includes first and second, 4-input look up tables (4-LUTs) 140-1 and 140-2. Such 4-LUTs are well understood by those skilled in the art. Each 4-LUT 140-1 and 140-2 are preferably driven by 4 of the 8 input lines 114-1. First 4-LUT 140-1 drives a first flip-flop 142-1 which drives a first individual line of output lines 120-1. A first bypass line 144-1 can be used to bypass first flip-lop 142-1. Second 4-LUT 140-2 drives a second flip-flop 142-2 which drives a second individual line of output lines 120-1. A second bypass line 144-2 can be used to bypass second flip-flop 142-2. LE 112-1 illustrated in FIG. 2 may be simplified from an actual LE used in a LAB which may include additional or different components. An LE using additional components and which may be used in a method and device of the present invention is disclosed, for example, in D. Lewis et al., "The Stratix™ Routing and Logic Architecture" Altera Corporation, 101 Innovation Drive, San Jose, Calif. 95134, and Proceedings of the 2003 ACM/SIGDA Symposium on FPGAs, (available from ACM Press, ACM-ISBN 1-58113-651-X.

Referring again to FIG. 1, in LAB 110, LAB lines 116 drive sets of input lines 114-1 through 114-8 and in LAB 210, LAB lines 216 drive sets of input lines 214-1 through 214-8. Preferably, as is understood by those skilled in the art, the 38 individual lines of LAB lines 116 and the 38 individual lines of LAB lines 216 are interconnected to each set of 8 individual input lines 114-1 through 114-8 and 214-1 through 214-8, respectively, using multiplexers and/or programmable elements including RAMs, EPROMs, EEPROMs, fuses, anti-fuses or the like which can programmatically either connect or disconnect one line with a second intersecting line. In this way, any individual line of LAB lines 116 can drive any individual line of input lines 114-1 through 114-8 and any individual line of LAB lines 216 can drive any individual line of input lines 214-1 through 214-8.

PLD portion 100 also includes a programmable swap multiplexer (MUX) 130 which is driven by output lines 120-1 through 120-8. Preferably, swap MUX 130 includes two 16 line inputs. Thus, preferably, each individual line of output lines 120-1 through 120-8 is fed directly into one of the two 16 line inputs of swap MUX 130 without passing through additional MUXs and/or programmable elements. It is contemplated, however, that each input of swap MUX 130 include fewer than 16 inputs and that a selection must be made of which output lines 120-1 through 120-8 drive swap MUX 130. Such a selection can be made using MUXs and/or programmable elements as is understood in the art.

Also driving swap MUX 130 are a set of tap lines 224 which tap off of LAB lines 216 of LAB 210. Preferably, there are 16 individual lines in the set of tap lines 224 to fully populate the second 16 line input of swap MUX 130. There may also be greater or fewer that 16 lines in the set of tap lines 224. Tap lines 224 connect to LAB lines 216 at tap line interconnect 226. FIG. 3a is a detailed view of a preferred embodiment of tap line interconnect 226. Individual LAB lines 216-1 through 216-38 of LAB lines 216 are illustrated as vertical lines (not all 38 individual LAB lines 216 are shown) and the 16 individual tap lines 224-1 through 224-16 of tab lines 224 are shown as horizontal lines (not all 16 individual tap lines 224 are shown). Preferably, 16 individual LAB lines 216-1 through 216-16 directly drive the 16 individual tap lines 224-1 through 224-16, each individual LAB line 216-1 through 216-16 driving a single individual tap line 224-1 through 224-16, respectively. Preferably, the interconnection between LAB lines 216 and tap lines 224 is fixed as shown in FIG. 2 and is not programmable. It is also considered, however, that LAB lines 216 be programmably interconnected with tap lines 224. For example, a programmable interconnect could be placed at the intersection of each individual LAB line, or any subset of LAB lines 216, and each individual tap line, or subset of tap lines 224. In this way, which individual LAB line drives which individual tap line would be configurable.

Referring again to FIG. 1, LABs 110 and 210 also include sets of local lines 118 and 218, respectively. Local lines 118 feed, along with LAB lines 116, input lines 114-1 through 114-8 and local lines 218 feed, along with LAB lines 216, input lines 214-1 through 214-8. Preferably there are 16 individual lines in each set of local lines 118 and 218, though it is considered that there be either greater or fewer such individual lines in each set of local lines 118 and 218. Preferably, as understood in the art, interconnections between local lines 118 and input lines 114-1 through 114-8 are such that any individual line of local lines 118 can drive any individual line of input lines 114-1 through 114-8. Swap MUX 130 drives local lines 118 and preferably includes a 16 line output. Thus, because as noted above, there are preferably 16 individual lines in local lines 118, each individual line of local lines 118 is driven by one individual line of the output of swap MUX 130.

Figure 2B:
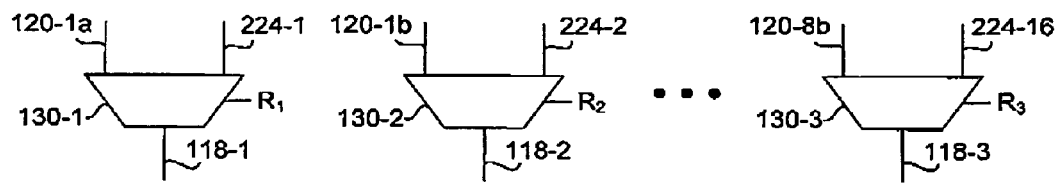
FIG. 2b is a schematic diagram illustrating details of the swap mux shown in FIG. 1.
Figure 3A:
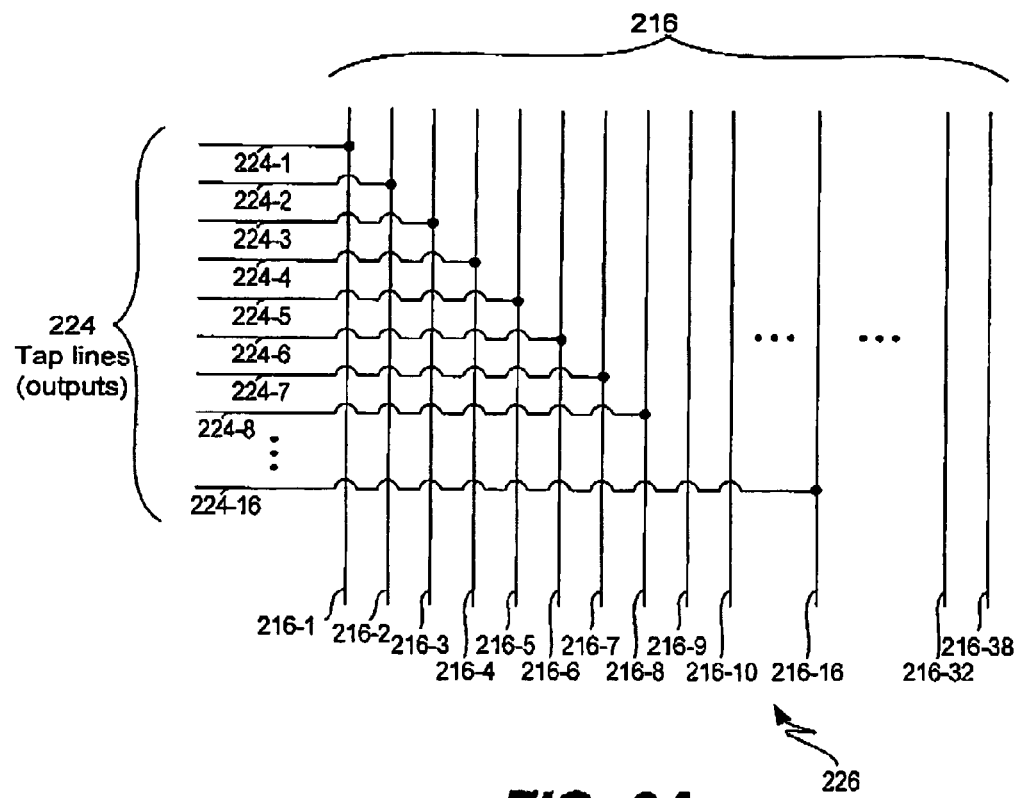
FIG. 3a is a schematic diagram illustrating a preferred embodiment of an interconnection between LAB lines and tap lines illustrated in FIG. 1 in accordance with the present invention.
Figure 3B:
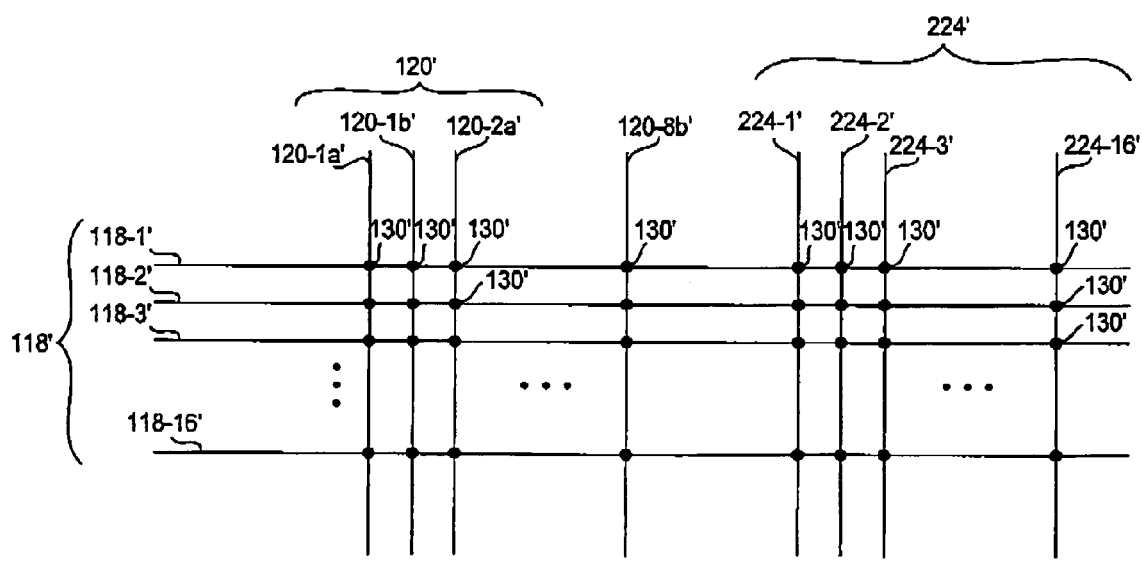
FIG. 3b is a schematic diagram illustrating a general embodiment of a the swap MUX shown in FIG. 1 and detailed in FIG. 2b.
Figure 3C:
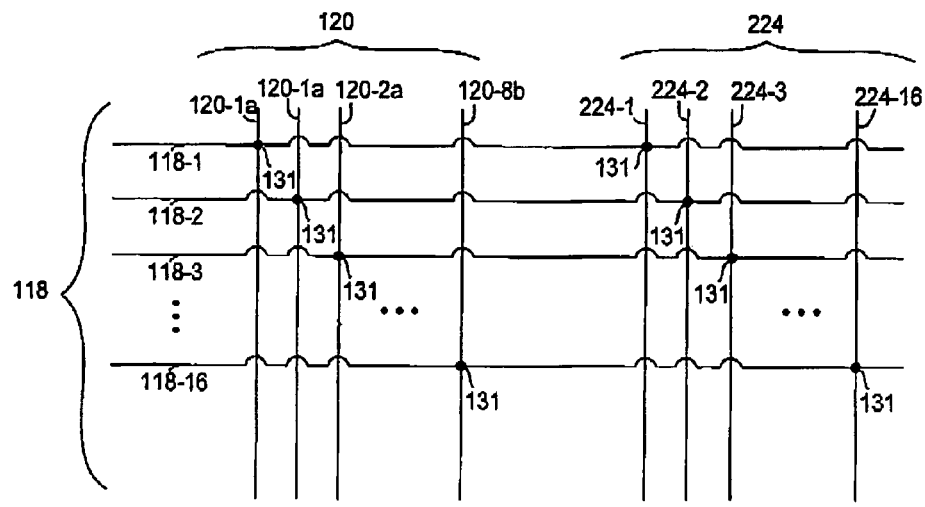
FIG. 3c illustrates a preferential embodiment wherein each swap MUX has only two inputs.

Preferentially, as shown in FIGS. 2b and 3c, swap MUX 130 operates such that each output is generated from an independently programmed MUX driven by one or more local lines 120 and one or more neighboring LAB lines 224. This detail is shown in FIG. 2b, where exactly one local and one lab line are joined with a 2:1 mux. In particular, FIG. 2b illustrates a series of 16, single bit 2 to 1 MUXs 130-1 through 130-16 (not all single bit 2 to 1 MUXs are shown in FIG. 2b) that make up swap MUX 130. MUX 130-1 is driven by individual local line 120-1a, a first individual line of local lines 120-1 driven by LE 112-1 of FIG. 1, and individual LAB line 224-1, MUX 130-2 is driven by individual local line 120-1b, as second individual line of local lines 120-1, and individual LAB line 224-2 and MUX 130-16 is driven by individual local line 120-8b, and LAB line 224-16. Each single bit 2 to 1 MUX 130-1 through 130-16 is configured with a single RAM bit R1 through R16, respectively. As such, a total of 16 RAM bits is necessary to configure full 16-bit swap MUX 130.

Alternatively, swap MUX 130 operates such that any individual line driving swap MUX 130 can drive an individual output line of swap MUX 130. That is, swap MUX 130 is able to select any individual line of output lines 120 and tap lines 224 to drive local lines 118, rather than being limited to selecting either all output lines 120 or all tap lines 224 to drive local lines 118. This functionally is illustrated in FIG. 3b, which shows output lines 120-1a' through 120-8b' and tap lines 224-1' through 224-16' driving local lines 118-1' through 118-16'. In FIG. 3b, individual lines 120-1a' and 120-1b' could each be one of the pair of lines of output lines 120-1' shown in FIG. 1. Similarly, individual lines 120-2a' and 120-2b' through 120-8b' (not all shown in FIG. 3b) could each be one of the pair of output lines 120-2' through 120-8', respectively. Output lines 120-1a' through 120-8b' and tap lines 224-1' through 224-16' intersect with local lines 118-1' through 118-16' at a plurality of programmable intersections 131'. As is understood in the art, each programmable intersection 131' can be programmed to either interconnect or not interconnect two lines crossing at the particular programmable intersection. Thus, because any of out output lines 120-1a' through 120-8b' and tap lines 224-1' through 224-16' can be interconnected to any local lines 118-1' through 118-16', any of output lines 120-1a' through 120-8b' and tap lines 224-1' through 224-16' can drive local lines 118-1' through 118-16'.

FIG. 3c illustrates the preferred configuration of swap MUX 130 in the notation of FIG. 3b. Specifically, individual lines 120-1a and 120-1b are each one of the pair of lines of output lines 120-1 shown in FIG. 1. Similarly, individual lines 120-2a and 120-2b through 120-8b (not all shown in FIG. 3b) are each one of the pair of output lines 120-2 through 120-8, respectively. Output lines 120-1a through 120-8b and tap lines 224-1 through 224-16 intersect with local lines 118-1 through 118-16 at a plurality of programmable intersections 131. Location of filled circles at intersections 131 indicate programmable connections. Skipovers at intersections of output lines 120-1a through 120-8b and tap lines 224-1 through 224-16 with local lines 118-1 through 118-16 indicate that connections cannot be made at these intersection. Thus, only one of two connections, either an output line or a tap line, with each local line can be made in the configuration of FIG. 3c.

As discussed above, LAB lines 116 of LAB 110 include 38 individual lines that provide input signals to LEs 112-1 through 112-8. In operation, if LAB 110 is configured with a function requiring 38 or fewer inputs, swap MUX 130 is preferably configured to pass the output signals on the sets of output lines 120-1 through 120-8 through to the set of local lines 118 such that, if necessary, these output signals can also drive LEs 112-1 through 112-8.

However, because LEs 112-1 through 112-8 each include 8 inputs, LAB 110 can be driven with up to 64 inputs. And, in some circumstances, it is desirable to drive one or more LABs, such as LAB 110, in a PLD with more that 38 inputs. Such circumstances may arise, for example, when LAB 110 is configured to carry out arithmetic functions having multiple bit inputs. When more than the 38 inputs provided by LAB lines 116 are needed to drive LAB 110, PLD portion 100 is able to provide such inputs. Specifically, in such circumstances, swap MUX 130 can be configured to pass to local lines 118 signals from tap lines 224. Because the set of tap lines 224 and the set of local lines 118 each include 16 individual lines, 16 additional input signals can be routed to LEs 112-1 through 112-8 of LAB 110, providing, in the example of FIG. 1, a maximum of 52 inputs to LAB 110.

PLD portion 100 additionally includes a second swap MUX 230, which, like swap MUX 130, preferably includes two, 16 line inputs and a single 16 line output. In manner analogous to that described above with respect to first swap MUX 130 and outputs 120-1 through 120-8, outputs 220-1 through 220-8 of LAB 210 drive a first input of second swap MUX 230. And in a manner analogous to that described above with respect to first swap MUX 130 and local lines 118, local lines 218 of LAB 210 are driven by the output of second swap MUX 230. Additionally, FIG. 1 includes a second set of tap lines 324 which are preferably interconnected to the LAB lines of a third LAB (not shown) in a manner analogous to that discussed above with respect to tap lines 224 and LAB lines 216. Tap lines 324 drive a second input of swap MUX 230. The output of second swap MUX 230 drives local lines 218 of LAB 210. In this way, LAB 210 can be driven by LAB lines from a third LAB (not shown). Thus, more that one LAB in a PLD can be driven by inputs that also drive another LAB.

As described above, in a method and apparatus of the present invention, in order to provide additional inputs to a first LAB, inputs from a second LAB may be used. This is likely to be acceptable in most situations because typically, functions carried out by a LAB do not use all of the LAB line inputs provided for the LAB. And, in a case where one LAB requires more inputs than are provided by its LAB lines, it is likely that an adjacent LAB will not require all of its LAB line inputs. Further, even if an adjacent LAB requires all, or nearly all, of its LAB lines, the PLD can likely be reconfigured to move a function into the adjacent LAB that does not require so many of its LAB lines.

Figure 4:
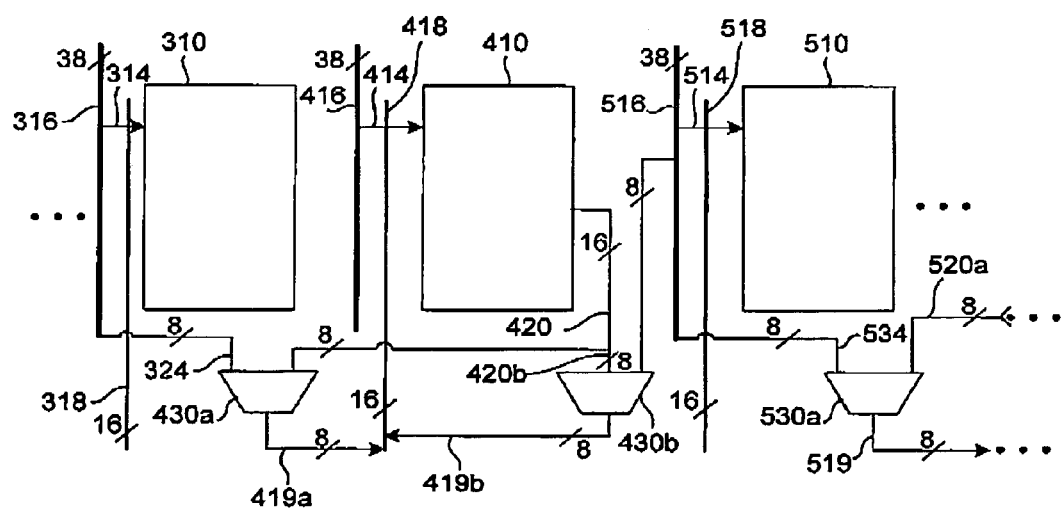
FIG. 4 is a schematic diagram illustrating another embodiment of a method and apparatus in accordance with the present invention including a portion of a PLD having two swap MUXs and in which a first LAB can be driven by either of two sets inputs which can also respectively drive a second LAB and a third LAB in accordance with the present invention.

FIG. 4 is a schematic diagram illustrating a second embodiment of a method and apparatus for providing additional inputs to a LAB. FIG. 4 shows a portion 300 of a PLD including a first, second and third LABs 310, 410 and 510, respectively. As with LABs 110 and 210 shown in FIG. 1, LABs 310, 410 and 510 each preferably include a plurality of LEs (not shown) for carrying out logic functions. LABs 310, 410 and 510 are driven from global lines (not shown) by sets of LAB lines 316, 416 and 516, respectively. Each set of LAB lines 316, 416 and 516 preferably include 38 individual lines, though any number of individual lines may be included. LABs 310, 410 and 510 also include sets local lines 318, 418 and 518, respectively, which each preferably include 16 individual lines, though any number of individual lines may be included. Both LAB lines 316, 416 and 516 and local lines 318, 418 and 518 can drive LEs on LABs 310, 410 and 510, respectively, through sets of inputs 314, 414 and 514, respectively. For clarity, in the schematic of FIG. 4, each set of inputs 314, 414 and 514 is indicated with a single arrow. It is to be understood, however, that each set of inputs 314, 414 and 514 can include a plurality of individual input lines which drive the LEs of LABs 310, 410 and 510, respectively, in the manner discussed above with respect to LABs 110 and 210. As discussed above with respect to LABs 110 and 210, preferably, any individual line of LAB lines 316, 416 and 516 and any individual local line of local lines 318, 418 and 518, respectively, can drive any LE of LABs 310, 410 and 510, respectively.

LEs of second LAB 410 drive a set of output lines 420 preferably in a manner similar to that described above and shown in FIG. 1 with respect to LEs 112-1 through 112-8 and output lines 120-1 through 120-8. Preferably, there are 16 individual lines in output lines 420, however any number of individual lines may be included in output lines 420.

Output lines 420 are preferably broken into two subsets of branch lines 420a and 420b. In the example shown in FIG. 4, each subset of branch lines 420a and 420b include 8 individual lines. However, branch lines 420a and 420b can each include any number of lines such that the total number of individual lines in branch lines 420a and 420b is equal to or less than the number of individual lines in output lines 420. Branch lines 420a drive a first swap MUX 430a and branch lines 420b drive a second swap MUX 430b. First MUX output lines 419a and second MUX output lines 419b each drive local lines 418. In the example shown in FIG. 3a, first MUX output lines preferably include 8 individual lines 419a and second MUX output lines 419b include 8 individual lines. Preferably, the 8 individual lines of first MUX output lines 419a drive directly into a first set of 8 individual lines of local lines 418 and the 8 individual lines of second MUX output lines 419b drive directly into a second set of 8 individual lines of local lines 418. Preferably, in this way, when a selection bit of first swap MUX 430a is appropriately set, branch lines 420a will drive the first set of 8 local lines 418 and when a selection bit of second swap MUX 430b is appropriately set, branch lines 420b will drive the second set of 8 local lines 418.

In the embodiment of FIG. 4, LAB lines 316 can drive a set of first tap lines 324 and LAB lines 516 can drive a set of second tap lines 524, respectively. Preferably, first tap lines 324 include 8 individual lines, but can also include greater or fewer individual lines. Also, preferably, second tap lines 524 include 8 individual lines, but can also include greater or fewer individual lines. The interconnection between LAB lines 316 and first set of tap lines 324 and the interconnection between LAB lines 516 and second set of tap lines 524 is preferably as discussed above and shown in FIG. 3a regarding LAB lines 216 and tap lines 224.

First set of tap lines 324 drive an input of first swap MUX 430a and second set of tap lines 524 drive an input of second swap MUX 430b. Thus, depending on the state of a selection bit of swap MUX 430a, either first set of tap lines 324 or branch lines 420a will drive 8 individual lines of local lines 418. And, depending on the state of a selection bit of swap MUX 430b, either second set of tap lines 524 or branch lines 420b will drive 8 individual lines of local lines 418. If branch lines 420a and 420b drive local lines 418 through swap MUXs 430a and 430b, respectively, then local lines 418 will be entirely driven by LE output lines 420. However, if LAB 410 requires more inputs from global lines than the 38 inputs that, in the embodiment shown in FIG. 3a, can be provided by LAB lines 414, then a selection bit of swap MUX 430a can be set to drive local lines 418 from LAB lines 316. In this way, LAB 410 can be driven by inputs from LAB 310. Further, if 8 additional inputs from LAB lines 316 are not enough to meet the requirements of a particular configuration of LAB 410, then a selection bit of swap MUX 430b can be set to drive local lines 418 with an additional 8 lines from LAB lines 516. In this way, in the example shown in FIG. 4, the LEs of LAB 410 can be driven by up to an additional 16 inputs. Though LABs 310 and 510 are illustrated in FIG. 4 as adjacent to LAB 410, it is not necessary that a LAB be able to receive inputs from LAB lines of other LABs that are only adjacent to the LAB. In particular, it is considered that LAB 310 be able to receive inputs from LAB lines associated with LABs that are not adjacent to LAB 310 or that are above and/or below LAB 310 in PLD 300.

As discussed above with respect to swap MUX 130, it is also considered that swap MUX 430a can be configured such that any individual line of branch lines 420a along with any individual line of tab lines 324 can drive any one of the individual lines of lines 419a and swap MUX 430b can be configured such that any individual line of branch lines 420b along with any individual line of tap lines 524 can drive any one of the individual lines of lines 419b.

As illustrated in FIG. 4, it is considered that more than one LAB of PLD 300 be able to receive input signals from LAB lines associated with other LABs. As shown in FIG. 4, a first input of a third swap MUX 530a can receive inputs from third tap lines 534, which can in turn be driven by LAB lines 516. Swap MUX 530a can also receive inputs from LE output lines 520 which are driven by a LEs in a fourth LAB (not shown). Third swap MUX 530a drives MUX output lines 519, which can drive the local lines (not shown) of a fourth LAB (not shown). In this way, third swap MUX 530a provides the same function for a fourth LAB (not shown) that first swap MUX 430a provides for LAB 410. In particular, swap MUX 530a allows LAB lines 516 to drive the local lines (not shown) of a fourth LAB (not shown) of PLD 300.

Figure 5:
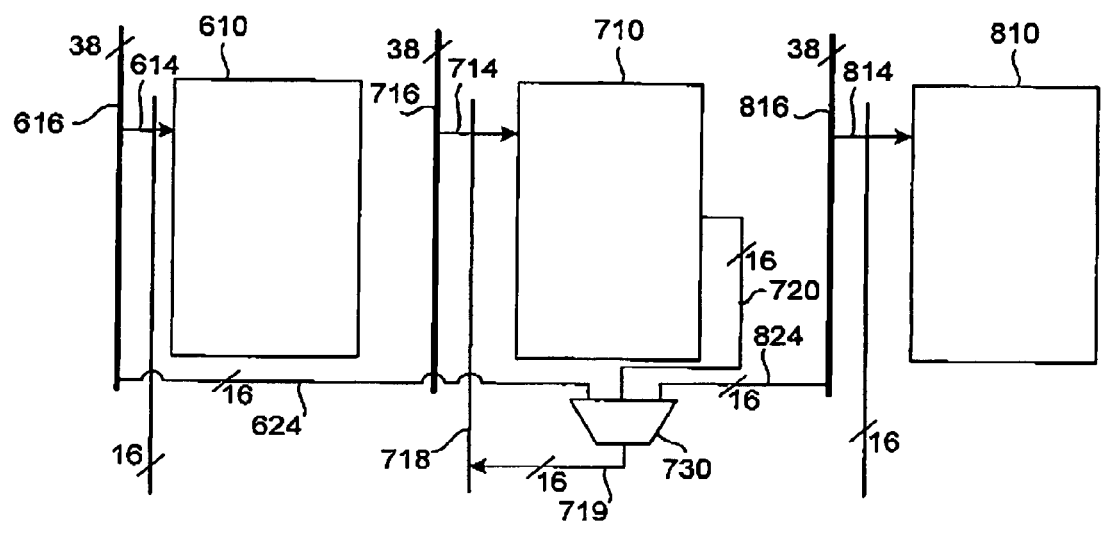
FIG. 5 is a schematic diagram illustrating still another embodiment of a method and apparatus in accordance with the present invention including a portion of a PLD having a single, three input swap MUX and in which a first LAB can be driven by either of two sets of inputs which can also respectively drive a second LAB and a third LAB in accordance with the present invention.

FIG. 5 is a schematic diagram illustrating another embodiment of the present invention. FIG. 5 shows a portion 600 of a PLD including first, second and third LABs 610, 710 and 810. As with LABs 110 and 210 shown in FIG. 1, LABs 610, 710 and 810 each preferably include a plurality of LEs (not shown) for carrying out logic functions. LABs 610, 710 and 810 are driven from global lines (not shown) by sets of LAB lines 616, 716 and 816, respectively. Each set of LAB lines 616, 716 and 816 preferably include 38 individual lines, though any number of individual lines may be included. LABs 610, 710 and 810 also include sets local lines 618, 718 and 818, respectively, which each preferably include 16 individual lines, though any number of individual lines may be included. Both LAB lines 616, 716 and 816 and local lines 618, 718 and 818 can drive LEs on LABs 610, 710 and 810, respectively, through sets of inputs 614, 714 and 814, respectively. For clarity, in the schematic of FIG. 5, each set of inputs 614, 714 and 814 is indicated with a single arrow. It is to be understood, however, that each set of inputs 614, 714 and 814 can include a plurality of individual input lines which drive the LEs of LABs 610, 710 and 810, respectively, in the manner discussed above with respect to LABs 110 and 210. As discussed above with respect to LABs 110 and 210, preferably, any individual line of LAB lines 616, 716 and 816 and any individual local line of local lines 618, 718 and 818, respectively, can drive an LE of LABs 610, 710 and 810, respectively.

LEs of second LAB 710 drive a set of output lines 720 preferably in a manner similar to that described above and shown in FIG. 1 with respect to LEs 112-1 through 112-8 and output lines 120-1 through 120-8. Preferably, there are 16 individual lines in output lines 720, however any number of individual lines may be included in output lines 720. In the example shown in FIG. 4, output lines 720 drive one input of swap MUX 730. Output lines 719 of swap MUX 730 preferably drive directly into local lines 718. Thus, by appropriately setting a selection bit (not shown) of swap MUX 730, output lines 720 can drive local lines 718.

LAB portion 600 also includes first tap lines 624 and a second tap lines 824. First tap lines can be driven by LAB lines 616 and second tap lines can be driven by LAB lines 816. Preferably, first tap lines 624 include 16 individual lines, but can also include greater or fewer individual lines. Also, preferably, second tap lines 824 include 16 individual lines, but can also include greater or fewer individual lines. The interconnection between LAB lines 616 and first tap lines 624 and the interconnection between LAB lines 816 and second tap lines 824 is preferably as discussed above and shown in FIG. 1 regarding LAB lines 216 and tap lines 224.

As shown in FIG. 4, swap MUX 730 is preferably a 3:1 MUX and first tap lines 624 and second tap lines 824 each drive an input to swap MUX 730. Thus, by appropriately setting a selection bit (not shown) of swap MUX 730, either first tap lines 624 or second tap lines 824 can drive local lines 718 through swap MUX output lines 719. In this way, if LAB 710 requires more that the 38 inputs provided by LAB lines 716, either 16 additional individual lines of LAB lines 616 or 16 additional individual lines of LAB lines 816 can be used to drive the LEs of LAB 719 through swap MUX 730. As discussed above with respect to swap MUX 130, it is also considered that any individual line of tap lines 624 along with any individual line of output lines 720 and any individual line of tap lines 824 can drive any individual line of output lines 719.

Various modifications to the preferred embodiments can be made without departing from the spirit and scope of the invention. Thus, the foregoing description is not intended to limit the invention which is described in the appended claims.

What is claimed as new and desired to be protected by Letters Patent of the United States is:

1. A programmable logic device (PLD) including:
   at least first and second logic array blocks (LABs);
   a plurality of first signal lines capable of driving the second LAB;
   a plurality of output lines driven by the first LAB; and
   a first swap multiplexer (MUX) having a first selectable input capable of being driven directly by at least one of the plurality of output lines and a second selectable input capable of being directly driven at least one of the plurality of the first signal lines, and an output capable of driving the at least first LAB.

2. The PLD of claim 1 wherein:
   the first LAB includes a first plurality of logic elements (LEs) and the second LAB includes a second plurality of LEs;
   at least one of the plurality of output lines is driven by at least one of the first plurality of LEs;
   at least one of the plurality of the first signal lines is capable of driving at least one of the second plurality of LEs; and
   the output of the first swap MUX is capable of driving at least one of the first plurality of LEs.

3. The PLD of claim 2 wherein:
   the first LAB includes a plurality of local lines at least one of which drives at least one of the first plurality of LEs; and
   the output of the first swap MUX drives at least one of the plurality of local lines.

4. The PLD of claim 3 further including at least one additional signal line for exclusively driving the second LAB.

5. The PLD of claim 4 wherein the plurality of first signal lines include a plurality of LAB lines which drive the second LAB and a plurality of tap lines at least one of which is interconnected with at least one of the plurality of LAB lines, at least one of the plurality of tap lines driving the first selectable input of first swap MUX.

6. The PLD of claim 5 wherein the interconnection between the at least one LAB line and at least one tap line is fixed.

7. The PLD of claim 6 further including at least a third LAB and a plurality of second signal lines capable of driving the third LAB wherein the first swap MUX includes a third selectable input and at least one of the second signal lines drives the third selectable input.

8. The PLD of claim 6 further including:
   at least a third LAB and a plurality of second signal lines capable of driving the third LAB;
   a second swap MUX having a first selectable input and second selectable input the first selectable input capable of being driven by at least one of the second signal lines; and
   wherein the plurality of tap lines include a first set of tap lines and a second set of tap lines, at least one of the first set of tap lines capable of driving the first selectable input of the first swap MUX and at least one of the second set of tap lines capable of driving the second selectable input of the second swap MUX.

9. A programmable logic device (PLD) including:
   at least first and second logic array blocks (LABs), the first LAB including a first plurality of logic elements (LEs) and the second LAB including a second plurality of LEs;
   a plurality of first signal lines capable of driving at least one of the second plurality of LEs;
   a plurality of output lines driven by at least one of the first plurality of LEs; and
   a first swap multiplexer (MUX) having a first selectable input capable of being driven directly by at least one of the plurality of output lines and a second selectable input capable of being directly driven by at least one of the plurality of first signal lines, and an output capable of driving at least one of the first plurality of LEs.

10. The PLD of claim 9 wherein:
    the first LAB includes a plurality of local lines which drive the first plurality of LEs; and
    the output of the first swap MUX drives at least one of the plurality of local lines.

11. The PLD of claim 10 wherein the plurality of first signal lines include a plurality of LAB lines at least one of which drives the second LAB and a plurality of tap lines at least one of which is interconnected with at least one of the LAB lines, at least one of the tap lines driving the first selectable input of the first swap MUX.

12. The PLD of claim 11 further including at least a third LAB and a plurality of second signal lines capable of driving the third LAB wherein the first swap MUX includes a third selectable input and at least one of the second signal lines drives the third selectable input.

13. The PLD of claim 11 further including:
    at least a third LAB and a plurality of second signal lines capable of driving the third LAB;
    a second swap MUX having a first selectable input and a second selectable input the first selectable input capable of being driven by at least one of the second signal lines; and
    wherein the plurality of tap lines include a first set of tap lines and a second set of tap lines, at least one of the first set of tap lines capable of driving the first selectable input of the first swap MUX and at least one of the second set of tap lines capable of driving the second selectable input of the second swap MUX.

14. A method of driving logic array blocks (LABs) in a programmable logic device (PLD) including:
    providing at least first and second LABs in the PLD;
    driving the second LAB with at least one of a first plurality of signal lines;
    driving at least one of a plurality of output lines with the first LAB;

directly driving a first selectable input of a first swap multiplexer (MUX) with at least one of the plurality of output lines;
directly driving a second selectable input of the first swap MUX with at least one of the plurality of first signal lines; and
driving at least the first LAB with an output of the first swap MUX.

15. The method of claim 14 further including:
providing a first plurality of logic elements (LEs) in the first LAB;
providing a second plurality of LEs in the second LAB;
driving at least one of the plurality of output lines with at least one of the first plurality of LEs; and
driving at least one of the second plurality of LEs with at least one of the plurality of first signal lines.

16. The method of claim 15 including:
providing a plurality of local lines in the first LAB;
driving at least one of the first plurality of LEs with at least one of the plurality of local lines; and
driving at least one of the plurality of local lines with the output of the first swap MUX.

17. The method of claim 16 further including providing at least one additional signal line for exclusively driving the second LAB.

18. The method of claim 17 further including;
providing a plurality of LAB lines and a plurality of tap lines in the plurality of first signal lines;
driving the second LAB with at least one of the plurality of LAB lines; and
interconnecting at least one of the plurality of tap lines with at least one of the plurality of LAB lines;
driving the first selectable input of the first swap MUX with at least one of the plurality of tap lines.

19. The method of claim 18 further including fixing the interconnection between the at least one of the plurality of LAB lines and the at least one of the plurality of tap lines.

20. The method of claim 19 further including
providing at least a third LAB and a plurality of second signal lines;
driving the at least third LAB with at least one of the plurality of second signal lines
providing a third selectable input in the first swap MUX; and
driving the third selectable input with at least one of the plurality of second signal lines.

21. The method of claim 19 further including:
providing at least a third LAB and a plurality of second signal lines;
driving the third lab with at least one of the plurality of second signal lines;
providing a second swap MUX having a first selectable input and a second selectable input;
driving the first selectable input with at least one of the plurality of second signal lines;
including in the plurality of tap lines a first set of tap lines and a second set of tap lines;
driving the first selectable input of the first swap MUX with at least one of the first set of tap lines; and
driving the second selectable input of the second swap MUX with at least one of the second set of tap lines.

* * * * *